(12) United States Patent
Kawai et al.

(10) Patent No.: US 11,004,699 B2
(45) Date of Patent: May 11, 2021

(54) ELECTRONIC DEVICE AND METHOD FOR MANUFACTURING THE SAME

(71) Applicant: OMRON Corporation, Kyoto (JP)

(72) Inventors: Wakahiro Kawai, Kyoto (JP); Tetsuya Katsuragawa, Tsurugashima (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/336,923

(22) PCT Filed: Sep. 19, 2017

(86) PCT No.: PCT/JP2017/033675
§ 371 (c)(1),
(2) Date: Mar. 27, 2019

(87) PCT Pub. No.: WO2018/092407
PCT Pub. Date: May 24, 2018

(65) Prior Publication Data
US 2020/0035511 A1    Jan. 30, 2020

(30) Foreign Application Priority Data

Nov. 21, 2016 (JP) .............................. JP2016-226044

(51) Int. Cl.
| | | |
|---|---|---|
| *H01L 21/00* | (2006.01) | |
| *H01L 21/56* | (2006.01) | |
| *H01L 23/538* | (2006.01) | |
| *H01L 23/00* | (2006.01) | |
| *H05K 1/14* | (2006.01) | |
| *H01L 23/31* | (2006.01) | |

(52) U.S. Cl.
CPC ........ *H01L 21/565* (2013.01); *H01L 23/5387* (2013.01); *H01L 24/03* (2013.01); *H05K 1/147* (2013.01); *H01L 23/31* (2013.01)

(58) Field of Classification Search
CPC .......... H01L 21/56; H01L 23/31; H01L 23/12
See application file for complete search history.

(56) References Cited

U.S. PATENT DOCUMENTS

| | | |
|---|---|---|
| 2004/0190267 A1 | 9/2004 | Maruyama et al. |
| 2006/0124347 A1 | 6/2006 | Takaike |

(Continued)

FOREIGN PATENT DOCUMENTS

| | | |
|---|---|---|
| CN | 1802883 A | 7/2006 |
| CN | 101341805 A | 1/2009 |

(Continued)

OTHER PUBLICATIONS

The extended European search report (EESR) dated Jan. 8, 2020 in a counterpart European Patent application.

(Continued)

*Primary Examiner* — Caridad Everhart
*Assistant Examiner* — Ankush K Singal
(74) *Attorney, Agent, or Firm* — Metrolex IP Law Group, PLLC

(57) ABSTRACT

An electronic device comprises: an electronic component; a resin molded body in which the electronic component is embedded and fixed; and a bendable bend portion continuous with the resin molded body. For example, the bend portion is molded integrally with the resin molded body. Thus, electronic device can be reduced in size and thickness.

12 Claims, 7 Drawing Sheets

(56) References Cited

U.S. PATENT DOCUMENTS

| | | | |
|---|---|---|---|
| 2006/0272150 A1 | 12/2006 | Eguchi et al. | |
| 2007/0134849 A1* | 6/2007 | Vanfleteren | H01L 24/19 438/123 |
| 2008/0257589 A1 | 10/2008 | Ostmann et al. | |
| 2009/0072360 A1* | 3/2009 | Koga | H01L 24/49 257/669 |
| 2009/0277684 A1 | 11/2009 | Takahashi et al. | |
| 2010/0006327 A1 | 1/2010 | Yu et al. | |
| 2010/0006995 A1* | 1/2010 | Kasuya | H01L 23/562 257/676 |
| 2011/0281138 A1* | 11/2011 | Yoshioka | H01L 24/24 428/815 |
| 2013/0083496 A1 | 4/2013 | Franklin et al. | |
| 2014/0249368 A1* | 9/2014 | Hu | A61B 1/051 600/109 |
| 2015/0380848 A1 | 12/2015 | Kato | |
| 2016/0111379 A1* | 4/2016 | Ishiyama | H01L 23/3135 257/669 |
| 2016/0327977 A1 | 11/2016 | Tang et al. | |
| 2017/0103950 A1 | 4/2017 | Kawai | |

FOREIGN PATENT DOCUMENTS

| | | |
|---|---|---|
| CN | 106104777 A | 11/2016 |
| JP | H04-346490 A | 12/1992 |
| JP | H06-177490 A | 6/1994 |
| JP | 2004-295498 A | 10/2004 |
| JP | 2006-196865 A | 7/2006 |
| JP | 2009-147010 A | 7/2009 |
| JP | 2010-062284 A | 3/2010 |
| JP | 2011-114138 A | 6/2011 |
| JP | 5251845 B2 | 7/2013 |
| JP | 2015-207703 A | 11/2015 |
| JP | 2016-111037 A | 6/2016 |
| TW | 200806131 A | 1/2008 |
| TW | 201004516 A | 1/2010 |
| TW | 201606954 A | 2/2016 |
| WO | 2014185194 A1 | 11/2014 |

OTHER PUBLICATIONS

An English translation of the Written Opinion of the International Searching Authority dated Dec. 26, 2017.
The Taiwanese Office Action dated Sep. 26, 2018 in a counterpart Taiwanese patent application.
An English translation of the International Search Report ("ISR") of PCT/JP2017/033675 dated Dec. 26, 2017.
The Office Action dated Mar. 31, 2020 in a counterpart Japanese patent application.
Office Action ("CNOA") dated Jan. 6, 2021 in a counterpart Chinese patent application.

* cited by examiner

ELECTRONIC DEVICE AND METHOD FOR MANUFACTURING THE SAME

TECHNICAL FIELD

The present technique relates to a partially bendable electronic device and a method for manufacturing the same.

BACKGROUND ART

In recent years, due to increasing demand for microminiaturization of a portable device and the like, the device has only a limited area for fixing a rigid substrate on which electronic components are mounted. Accordingly, a technique is known in which a bendable flexible substrate is used to connect a plurality of rigid substrates that are not in the same plane.

FIG. 11 shows an example electronic device that combines rigid substrates and a flexible substrate. The electronic device shown in FIG. 11 includes rigid substrates 70, 75 and a flexible substrate 80.

Rigid substrate 70 has an electronic component 71 mounted thereon, the electronic component 71 being connected to interconnections 72a, 72b formed on rigid substrate 70. Rigid substrate 75 has electronic components 76a, 76b mounted thereon, the electronic components 76a, 76b being connected to interconnections 77a to 77c formed on rigid substrate 75. A conductive layer 81, which is formed on flexible substrate 80, is connected to interconnection 72b of substrate 70 via a conductive adhesive layer 90a and is also connected to interconnection 77a of substrate 75 via a conductive adhesive layer 90b. Thus, substrates 70, 75 are electrically connected to each other via bendable flexible substrate 80.

In the electronic device shown in FIG. 11, however, each of rigid substrates 70, 75 requires a terminal area for connection to flexible substrate 80, resulting in enlarged substrate area. Further, the increase in man-hour for assembly increases the manufacturing cost.

Japanese Patent Laying-Open No. 6-177490 (PTL 1) discloses a printed wiring board produced by integrating a flexible wiring board and rigid wiring boards together by sandwiching the flexible wiring board between the rigid wiring boards from above and below with adhesive layers being interposed. In the technique described in Japanese Patent Laying-Open No. 6-177490, the flexible wiring board and the rigid wiring boards can be connected via interlayer circuit interconnections, such as through holes. This eliminates the need for a terminal area for connection to the flexible substrate, thus preventing enlarged substrate area.

CITATION LIST

Patent Literature

PTL 1: Japanese Patent Laying-Open No. 6-177490

SUMMARY OF INVENTION

Technical Problem

In the technique described in Japanese Patent Laying-Open No. 6-177490, however, since the flexible wiring board is sandwiched between the rigid wiring boards from above and below, the printed wiring substrate is disadvantageously thick.

Further, the printed wiring substrate is thicker by electronic components mounted on the printed wiring substrate via, for example, solder.

Further, the technique requires, for example, laminating press and a large apparatus for multi-layering the rigid wiring boards and the flexible substrate. This disadvantageously increases the manufacturing cost.

The present invention has been made by focusing on the problems of the conventional technique described above. An object of the present invention is to provide an electronic device including a bendable bend portion and having a reduced size and thickness, and also provide a method for manufacturing such an electronic device with reduced manufacturing cost.

Solution to Problem

According to one aspect, an electronic device comprises: an electronic component; a resin molded body in which the electronic component is embedded and fixed; and a bendable bend portion continuous with the resin molded body.

Preferably, the bend portion is molded integrally with the resin molded body with resin. Alternatively, the resin molded body may support the bend portion, with a part of the bend portion being embedded in the resin molded body.

Preferably, a surface of the resin molded body includes an exposed surface at which the electronic component is exposed. A surface of the bend portion includes a continuous surface continuous with the exposed surface. The electronic device further comprises an interconnection formed on the exposed surface and on the continuous surface, the interconnection being connected to the electronic component.

For example, the interconnection extends continuously from the electronic component to the continuous surface. Alternatively, the interconnection may include a first interconnection formed on the exposed surface and connected to the electronic component, and a second interconnection formed on the continuous surface beforehand and connected to the first interconnection.

The material of the bend portion is higher in breaking elongation percentage than the material of the resin molded body. For example, the bend portion may be made of a resin having a breaking elongation percentage of 300% or more. The resin molded body may be made of a resin having a breaking elongation percentage of 150% or less. The resin molded body may contain a filler.

According to another aspect, a method for manufacturing an electronic device comprises: sticking an electronic component to a sheet; placing the sheet in a molding die and filling the molding die with resin, thereby integrally molding a resin molded body and a bendable bend portion, the resin molded body having the electronic component embedded therein, the bend portion being thinner than the resin molded body, and forming an interconnection on a sheet bonded surface of the resin molded body and on a continuous surface of the bend portion, the sheet bonded surface having been in contact with the sheet and exposed by peeling the sheet from the resin molded body, the continuous surface being continuous with the sheet bonded surface.

According to still another aspect, a method for manufacturing an electronic device comprises: sticking an electronic component to a sheet; placing the sheet in two types of molding dies in order and performing two-color molding to integrally mold a resin molded body and a bendable bend portion, the resin molded body having the electronic component embedded therein, the bend portion being continuous with the resin molded body; and forming an interconnection on a sheet bonded surface of the resin molded body and on a continuous surface of the bend portion, the sheet bonded surface having been in contact with the sheet and exposed by peeling the sheet from the resin molded body, the continuous surface being continuous with the sheet bonded surface.

According to still another aspect, a method for manufacturing an electronic device comprises: sticking an electronic component and a bendable bend portion to a sheet; placing the sheet in a molding die and filling the molding die with resin, thereby molding a resin molded body in which the electronic component and a part of the bend portion are embedded; and forming a first interconnection on a sheet bonded surface of the resin molded body, the sheet bonded surface having been in contact with the sheet and exposed by peeling the sheet from the resin molded body.

Preferably, a surface of the bend portion includes a continuous surface continuous with the sheet bonded surface. The forming the first interconnection includes forming the first interconnection on the continuous surface.

Alternatively, a second interconnection may be formed beforehand on a surface of the bend portion. The sticking may include sticking the bend portion to the sheet so that the second interconnection faces the sheet; and the forming the first interconnection may include forming the first interconnection so that the first interconnection is connected to the second interconnection.

Advantageous Effects of Invention

The present disclosure can provide an electronic device including a bendable bend portion and having a reduced size and thickness.

DESCRIPTION OF EMBODIMENTS

Figure 1:
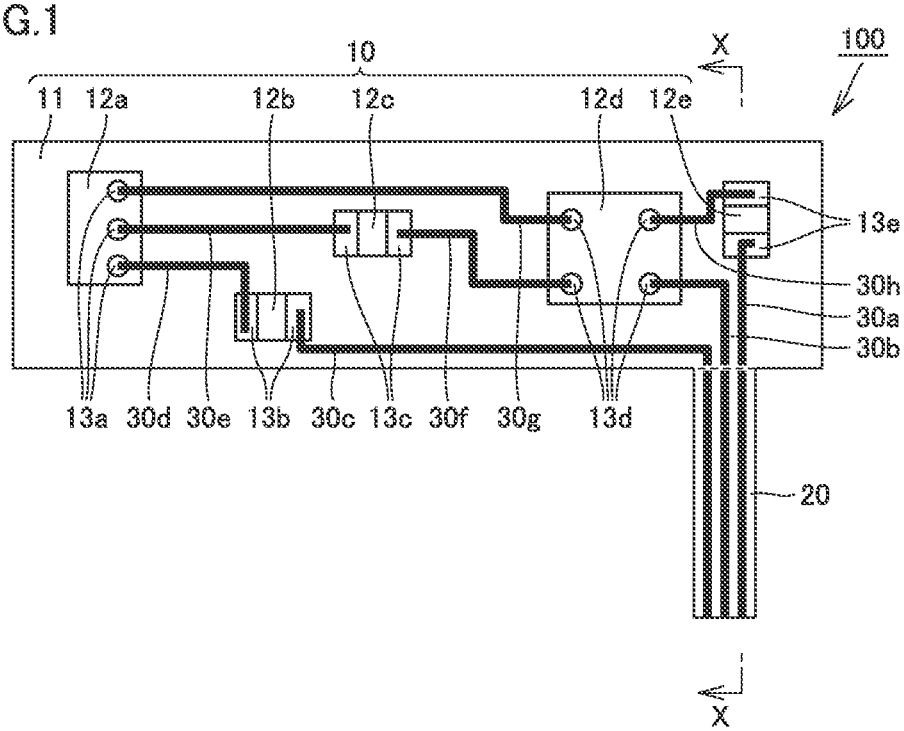
FIG. 1 is a plan view showing a schematic configuration of an electronic device in embodiment 1.

Embodiments of the present invention are described in detail with reference to the drawings. In the drawings, identical or corresponding parts are identically denoted, and the explanation thereof is not repeated.

Embodiment 1

(Configuration of Electronic Device)

Figure 2:
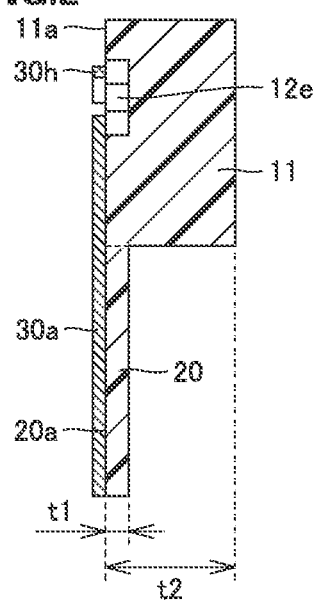
FIG. 2 is a cross-sectional view taken along line X-X and seen in the arrow direction in FIG. 1.

With reference to FIG. 1 and FIG. 2, a schematic configuration of an electronic device 100 in embodiment 1 is described. FIG. 1 is a plan view showing a schematic configuration of electronic device 100 in embodiment 1. FIG. 2 is a cross-sectional view taken along line X-X and seen in the arrow direction in FIG. 1.

Electronic device 100 is built in various types of electronic equipment, such as portable electronic equipment (e.g. wearable portable equipment), and a small-sized sensor, so that electronic device 100 performs a principal or auxiliary function of the electronic equipment. Examples of wearable portable equipment include a measuring instrument attached to clothes to measure a human body surface temperature; and a measuring instrument wound around an arm to measure a pulse, a blood pressure, or the like.

As shown in FIG. 1 and FIG. 2, electronic device 100 includes a main portion 10 having an electronic circuit formed thereon, a bendable bend portion 20, and an interconnection 30 (30a to 30h). Main portion 10 includes a resin molded body 11 and an electronic component 12 (12a to 12e).

Resin molded body 11 is generally in the form of a plate and is made of resin, such as polycarbonate (PC) or acrylonitrile-butadiene-styrene (ABS). The shape of resin molded body 11 is not particularly limited, and may be designed as appropriate in accordance with the shape of electronic device 100. The material of resin molded body 11 may be other types of resin (e.g. polypropylene (PP), or elastomer).

Resin molded body 11 has electronic component 12 (12a to 12e) embedded therein, thereby fixing electronic component 12. Resin molded body 11 has electronic component 12 embedded therein, so that electronic component 12 is exposed at an upper surface 11a.

Electronic component 12 (12a to 12e) is, for example, a chip capacitor, a chip resistance, or an integrated circuit (IC). The number and type of electronic components 12 are not particularly limited.

The surfaces of electronic components 12a to 12e exposed at resin molded body 11 respectively have electrodes 13a to 13e formed thereon.

Bend portion 20 is continuous with resin molded body 11 and is bendable.

Specifically, bend portion 20 is made of the same material as resin molded body 11 and is molded integrally with resin molded body 11. Bend portion 20 has a thickness t1 (e.g. 0.2 mm) thinner than a thickness t2 (e.g. 3 mm) of resin molded body 11 so that bend portion 20 is more bendable than resin molded body 11.

The surface of bend portion 20 includes a continuous surface 20a continuous with upper surface 11a of resin molded body 11. Here, two surfaces being "continuous" refers to a state in which the step between the two surfaces is so small that an interconnection formed on the surfaces does not break. Specifically, continuous surface 20a of bend portion 20 is flush with upper surface 11a of resin molded body 11.

Interconnection 30 (30a to 30h) is formed on at least upper surface 11a of upper surface 11a of resin molded body 11 and continuous surface 20a of bend portion 20. Interconnection 30 (30a to 30h) is connected to any of electrodes 13a to 13e of electronic components 12a to 12e.

Specifically, interconnections 30a to 30c are formed both on upper surface 11a of resin molded body 11 and on continuous surface 20a of bend portion 20, and continuously extend from electrode 13e of electronic component 12e, electrode 13d of electronic component 12d, and electrode 13b of electronic component 12b, respectively, to continuous surface 20a.

Interconnections 30d to 30h are formed on upper surface 11a of resin molded body 11. Interconnection 30d is connected to electrode 13a of electronic component 12a and electrode 13b of electronic component 12b. Interconnection 30e is connected to electrode 13a of electronic component 12a and electrode 13c of electronic component 12c. Interconnection 30f is connected to electrode 13c of electronic component 12c and electrode 13d of electronic component 12d. Interconnection 30g is connected to electrode 13a of electronic component 12a and electrode 13d of electronic component 12d. Interconnection 30h is connected to electrode 13d of electronic component 12d and electrode 13e of electronic component 12e.

Interconnection 30 can be easily formed by, for example, ink-jet printing with silver (Ag) ink. The ink-jet printing is a printing method in which ink is jetted from nozzles so that particulate ink deposits on a jetting target plane.

Since upper surface 11a of resin molded body 11 is continuous with continuous surface 20a of bend portion 20 as described above, interconnection 30 can be easily formed by ink-jet printing with silver (Ag) ink.

(Method for Manufacturing Electronic Device)

Figure 3:
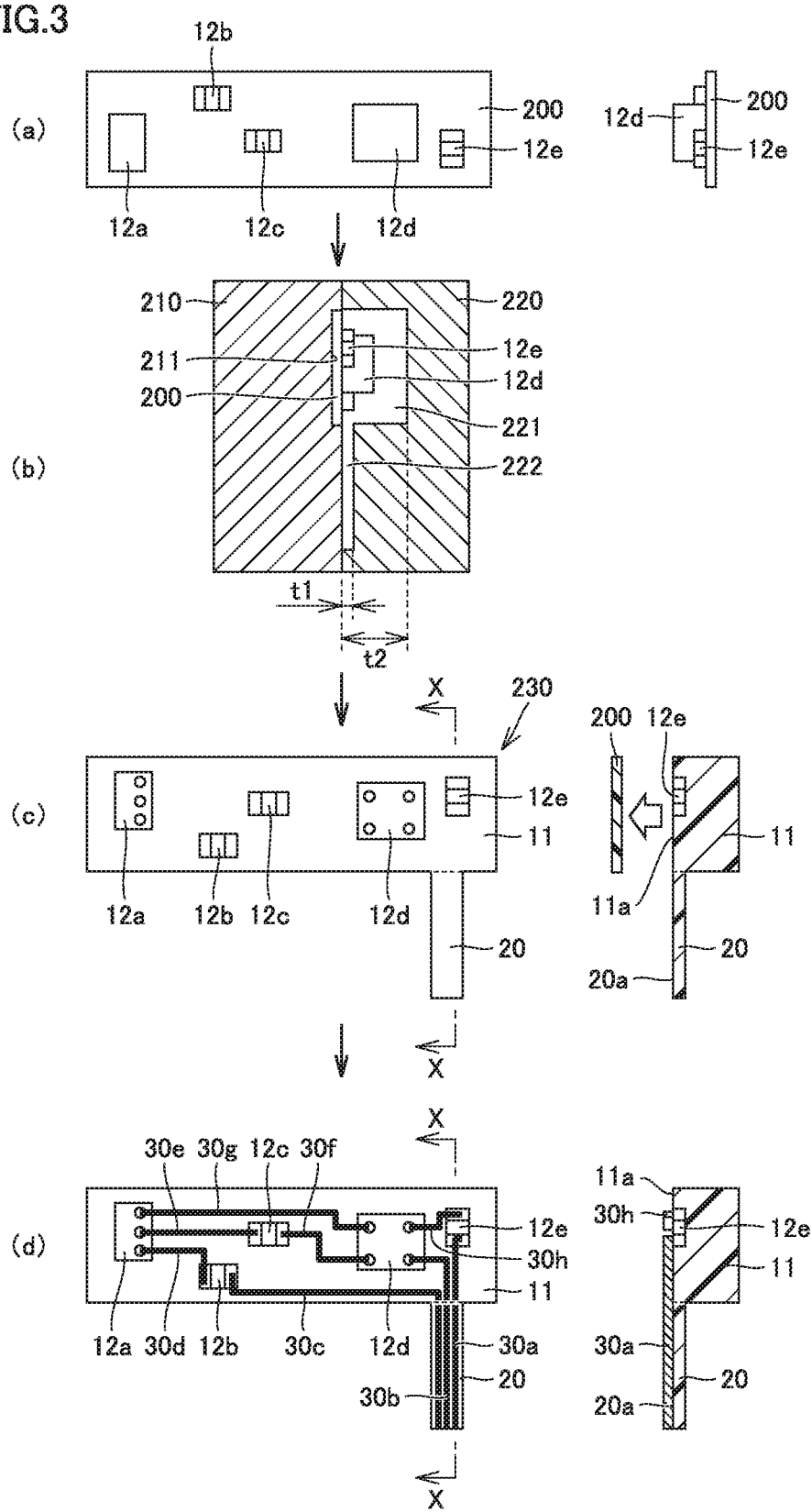
FIG. 3 is a diagram explaining a method for manufacturing an electronic device in embodiment 1.

Next, with reference to FIG. 3, an example method for manufacturing electronic device 100 in embodiment 1 is described. FIG. 3 is a diagram explaining a method for manufacturing electronic device 100. Diagrams for explaining the first to fourth steps for manufacturing electronic device 100 are shown in (a) to (d) of FIG. 3 respectively. In (a) of FIG. 3, a plan view is shown on the left, and a side view is shown on the right. In (b) of FIG. 3, a cross-sectional view is shown. In each of (c) and (d) of FIG. 3, a plan view is shown on the left, and a cross-sectional view taken along line X-X and seen in the arrow direction in the plan view is shown on the right.

(First Step)

As shown in (a) of FIG. 3, first, electronic components 12a to 12e are stuck to a rectangular temporary fixation sheet 200 with an adhesive (not shown), so as to be temporarily fixed thereto. At this time, electronic components 12a to 12e are stuck in such a manner that the side on which electrodes 13a to 13e are formed is in contact with temporary fixation sheet 200.

Examples of the material of temporary fixation sheet 200 include polyethylene terephthalate (PET), polyethylene naphthalate (PEN), and polyphenylene sulfide (PPS). Temporary fixation sheet 200 is preferably made of a material transparent to ultraviolet rays and having flexibility for the reasons described later.

The temporary fixation can be performed with, for example, an ultraviolet curable adhesive (not shown) applied to one side of temporary fixation sheet 200. For example, an ultraviolet curable adhesive is applied, with a thickness of 2 to 3 µm, to PET temporary fixation sheet 200 having a thickness of 50 µm. This application may be performed by, for example, ink-jet printing. After that, electronic components 12a to 12e are placed at prescribed positions. Then, electronic components 12a to 12e are irradiated with ultraviolet rays having an intensity of, for example, 3000 mJ/cm², from the side of temporary fixation sheet 200 on which electronic components 12a to 12e are not temporarily fixed. Thus, the adhesive cures and temporarily fixes electronic components 12a to 12e to temporary fixation sheet 200.

(Second Step)

Next, as shown in (b) of FIG. 3, temporary fixation sheet 200 having electronic components 12a to 12e temporarily fixed thereto is placed in a molding die formed by combining a first die 210 and a second die 220.

The surface of first die 210 that faces second die 220 has a recess 211 having the same shape as temporary fixation sheet 200. In this recess 211, temporary fixation sheet 200 is fitted. Thus, the surface of temporary fixation sheet 200 having electronic components 12a to 12e stuck thereto faces second die 220.

The depth of recess 211 is the same as the thickness of temporary fixation sheet 200. Accordingly, the surface of temporary fixation sheet 200 having electronic component 12 temporarily fixed thereto is flush with the surface of a part (where recess 211 is not formed) of first die 210 that faces second die 220.

The surface of second die 220 that faces first die 210 has a shape such that a space 221 having a depth t2 is defined at the part that faces recess 211 of first die 210, and such that a space 222 having a depth t1 is defined at the part that does not face recess 211 of first die 210. Space 221 communicates with space 222.

Injection molding of resin is performed by injecting resin material in spaces 221, 222 in the molding die formed by combining first die 210 and second die 220.

The conditions for the injection molding may be selected as appropriate in accordance with the resin. If polycarbonate (PC) is used, the injection molding is performed under an injection resin temperature of 270° C. and an injection pressure of 100 MPa, for example.

As the resin for the injection molding, various types of resin material can be used. A material having rubber elasticity, such as elastomer, allows more flexible deformation of bend portion 20. The conditions for the injection molding are not particularly limited.

(Third Step)

As shown in (c) of FIG. 3, a structure 230 obtained by injection molding at the second step is taken out of the molding die. Structure 230 includes resin molded body 11 which has the same shape (thickness t2) as space 221 of the molding die, and a bend portion 20 which has the same shape (thickness t1) as space 222 of the molding die.

Then, temporary fixation sheet 200 is peeled from structure 230. Thus, surfaces of electronic components 12a to 12e are exposed at the sheet bonded surface (corresponding to upper surface 11a) of resin molded body 11 that has been in contact with temporary fixation sheet 200.

If temporary fixation sheet 200 is a PET film, it largely deforms due to thermal change during the second step. Thus, temporary fixation sheet 200 can be easily peeled from structure 230.

In the second step, when temporary fixation sheet 200 is fitted into recess 211 of first die 210, the surface of temporary fixation sheet 200 having electronic component 12 temporarily fixed thereto is flush with the surface of first die 210 that faces second die 220. Therefore, the surface of the part of bend portion 20 that has been in contact with first die 210 forms continuous surface 20a that is continuous with and flush with upper surface 11a of resin molded body 11.

(Fourth Step)

As shown in (d) of FIG. 3, after the third step, interconnection 30 (30a to 30h) in a predetermined pattern is formed on upper surface 11a of resin molded body 11 and on continuous surface 20a of bend portion 20.

The formation of interconnection 30 can be performed by a method of spraying conductive material (e.g. silver ink) by ink-jet printing, by a method using aerosol or by a method using a dispenser, for example.

Using a method selected as appropriate, interconnection 30 can be easily formed with a high degree of freedom of circuit design, and each of electronic components 12a to 12e can be electrically connected simply and easily with no solder. Further, in industrial terms, since electronic components 12a to 12e can be connected after their positions are determined, electronic components 12a to 12e can be electrically connected more correctly and easily than in the case in which the positions of electronic components are adjusted on a printed substrate, for example.

Thus, electronic device 100 is completed, where electronic device 100 is provided with: main portion 10 including electronic component 12 and resin molded body 11; bend portion 20; and interconnection 30.

(Advantages)

As described above, electronic device 100 includes electronic component 12, resin molded body 11 in which electronic component 12 is embedded and fixed, and bendable bend portion 20 continuous with resin molded body 11.

Resin molded body 11, in which electronic component 12 is embedded and fixed, serves as a substrate on which electronic components are mounted. Thus, electronic device 100 can be reduced in size and thickness compared to a conventional one in which electronic components are mounted on the upper surface of a rigid substrate via, for example, solder.

Further, since bend portion 20 is continuous with resin molded body 11, electronic device 100 can be reduced in size and thickness compared to a case in which a flexible wiring board is sandwiched between rigid wiring boards from above and below (see Japanese Patent Laying-Open No. 6-177490).

Bend portion 20 is molded integrally with resin molded body 11. Thus, there is no connecting point that receives mechanical load between bend portion 20 and resin molded body 11. This increases reliability in connection between resin molded body 11 and bend portion 20. Further, there is no need to use a separate flexible substrate, which is comparatively expensive. Thus the cost of components is reduced.

The surface of resin molded body 11 includes upper surface (exposed surface) 11a at which electronic component 12 is exposed. The surface of bend portion 20 includes continuous surface 20a continuous with upper surface 11a. Electronic device 100 includes interconnection 30 formed on upper surface 11a and on continuous surface 20a, the interconnection 30 being connected to electronic component 12. This eliminates the need for a terminal area for electrically connecting the bend portion and resin molded body 11. Thus, further downsizing is achieved.

Electronic device 100 is manufactured by the steps in the following (1) to (3):

(1) sticking electronic component 12 to temporary fixation sheet 200;

(2) placing temporary fixation sheet 200 in a molding die (first die 210 and second die 220) and filling the molding die with resin, thereby integrally molding resin molded body 11 and bendable bend portion 20, the resin molded body 11 having electronic component 12 embedded therein, the bend portion 20 being thinner than resin molded body 11; and (3) forming interconnection 30 on upper surface (sheet bonded surface) 11a of resin molded body 11 and on continuous surface 20a of bend portion 20, the upper surface 11a having been in contact with temporary fixation sheet 200 and exposed by peeling temporary fixation sheet 200 from resin molded body 11, the continuous surface 20a being continuous with upper surface 11a.

By the above-described manufacturing method, electrical connection between main portion 10 and bend portion 20 is achieved by forming interconnection 30 on upper surface 11a of resin molded body 11 and on continuous surface 20a of bend portion 20. This eliminates the need for conventional complicated processes for connecting a flexible substrate to a rigid substrate, and also eliminates the need for an adhesive or other like members. Thus, the manufacturing cost of electronic device 100 can be reduced.

Embodiment 2

An electronic device in embodiment 2 of the present invention, which is a variation of electronic device 100 in embodiment 1, is provided with a plurality of main portions each including an electronic component and a resin molded body.

Figure 4:
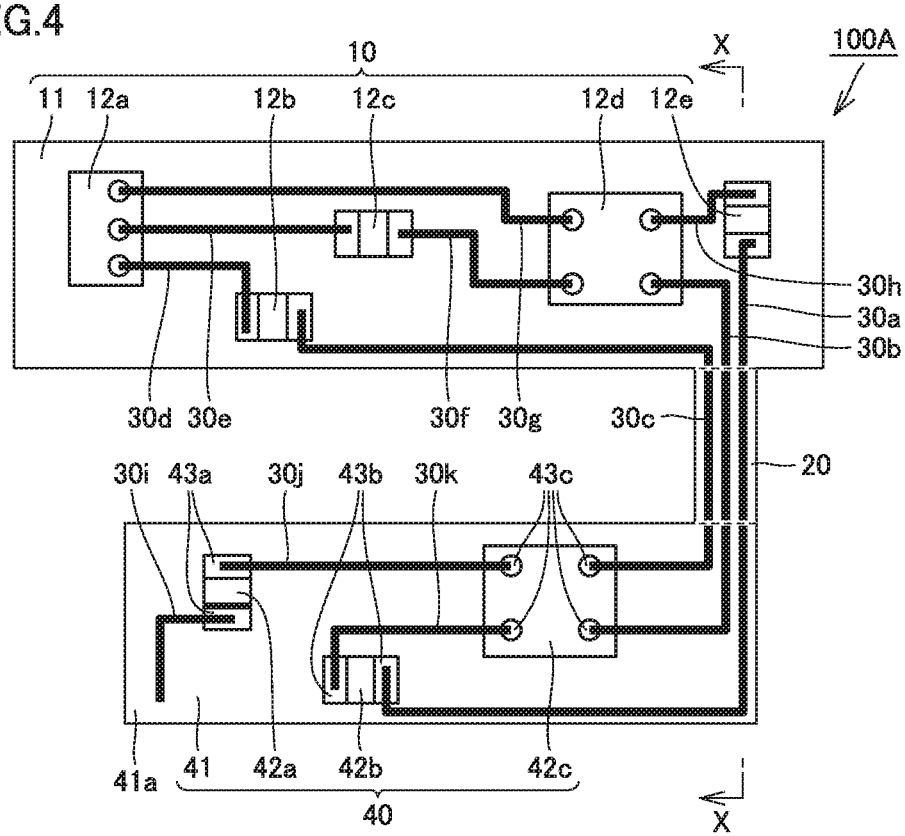
FIG. 4 is a plan view showing a schematic configuration of an electronic device in embodiment 2.
Figure 5:
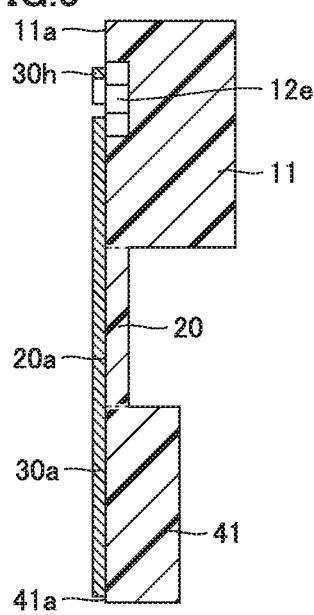
FIG. 5 is a cross-sectional view taken along line X-X and seen in the arrow direction in FIG. 4.

FIG. 4 is a plan view showing a schematic configuration of an electronic device 100A in embodiment 2. FIG. 5 is a cross-sectional view taken along line X-X and seen in the arrow direction in FIG. 4.

As shown in FIG. 4 and FIG. 5, electronic device 100A is different from electronic device 100 in embodiment 1 in that electronic device 100A includes a main portion 40 and interconnections 30i to 30k.

Main portion 40 is connected to an end of bend portion 20, opposite to the end connected to main portion 10. Main portion 40 includes a resin molded body 41 and an electronic component 42 (42a to 42c).

Resin molded body 41 is generally in the form of a plate. Resin molded body 41 is made of the same resin as resin molded body 11 and bend portion 20. Also, resin molded body 41 is molded integrally with resin molded body 11 and bend portion 20.

Resin molded body 41 has electronic component 42 (42a to 42c) embedded therein, thereby fixing electronic component 42. Resin molded body 41 has electronic component 42 embedded therein, so that electronic component 42 is exposed at an upper surface 41a.

Upper surface 41a of resin molded body 41 is continuous with continuous surface 20a of bend portion 20 and is flush with upper surface 11a of resin molded body 11 and continuous surface 20a.

Electronic component 42 (42a to 42c) is, for example, a chip capacitor, a chip resistance, or an integrated circuit (IC). The number and type of electronic components 42 are not particularly limited.

The surfaces of electronic components 42a to 42c exposed at resin molded body 41 respectively have electrodes 43a to 43c formed thereon.

Interconnections 30i to 30k are formed on upper surface 41a of resin molded body 41 and are connected to electrodes 43a to 43c of electronic components 42a to 42c.

In embodiment 2, interconnections 30a to 30c formed on continuous surface 20a of bend portion 20 are extended to upper surface 41a of resin molded body 41. Interconnection 30a is connected to electrode 43b of electronic component 42b. Interconnections 30b, 30c are connected to electrode 43c of electronic component 42c.

Electronic device 100A is manufactured in a method similar to that of embodiment 1. Specifically, in the first step described in embodiment 1, a temporary fixation sheet having electronic component 42 temporarily fixed thereto is prepared, separately from temporary fixation sheet 200 having electronic component 12 temporarily fixed thereto.

In the second step, temporary fixation sheet 200 having electronic component 12 temporarily fixed thereto and the temporary fixation sheet having electronic component 42 temporarily fixed thereto are placed in a molding die. Then, the molding die is injected with resin material to perform injection molding of resin. Thus, resin molded bodies 11, 41 and bend portion 20 are integrally molded. After that, in the fourth step, interconnection 30 (30a to 30k) may be formed on upper surface 11a of resin molded body 11, on upper surface 41a of resin molded body 41, and on continuous surface 20a of bend portion 20 continuous with upper surfaces 11a, 41a.

According to the above-described configuration, bendable bend portion 20 is disposed between a plurality of main portions 10, 40. Accordingly, even if main portion 10 and main portion 40 are placed not in the same plane, electronic device 100A can be built in electronic equipment, with the electronic circuit on main portion 10 being electrically connected to the electronic circuit on main portion 40 via bend portion 20.

Embodiment 3

An electronic device in embodiment 3 of the present invention is a variation of electronic device 100 in embodiment 1 or electronic device 100A in embodiment 2. In the electronic device in embodiment 3, the material of bend portion 20 is different from the material of resin molded body 11 of main portion 10 and resin molded body 41 of main portion 40.

For example, resin molded body 11 of main portion 10 and resin molded body 41 of main portion 40 are preferably made of a resin material having a breaking elongation percentage of 150% or less, such as polycarbonate (PC) or acrylonitrile-butadiene-styrene (ABS). The breaking elongation percentage refers to an elongation percentage of specimen at the time of breakage when a tensile test is performed in accordance with JIS K 7162, relative to the specimen before the test.

Therefore, main portions 10, 40 are less likely to deform and thus can be easily fixed in position.

On the other hand, bend portion 20 is preferably made of a resin material having a breaking elongation percentage of 300% or more, such as polyurethane (PU), which has a breaking elongation percentage of 580%, or polyamide (PA), which has a breaking elongation percentage of 300%.

Therefore, electronic device 100, 100A can be built in electronic equipment with bend portion 20 being elongated as necessary, depending on the other configuration of the electronic equipment in which electronic device 100, 100A is built, and depending on the positions at which main portions 10, 40 are placed. Thus, electronic device 100, 100A can be easily built in electronic equipment, even if there are variations in internal configuration among electronic equipments or even if some design change has been made in the internal configuration.

If electronic device 100A is built in a measuring instrument attached to clothes (e.g. underwear) for measuring a human body surface temperature, bend portion 20 is placed near human joints. In this case, bend portion 20 made of a resin material having a breaking elongation percentage of 300% or more can expand and contract in accordance with the motion of the person wearing the clothes.

Main portion 10 including a temperature sensor as electronic component 12 is placed at a comparatively stable position remote from human joints. Resin molded body 11 of main portion 10 preferably has elasticity to some degree in order to reduce stimulus to a human body when coming in contact with the human body surface. The resin material constituting resin molded body 11 is selected as appropriate from resin materials having a breaking elongation percentage of 150% or less, depending on the position at which main portion 10 is placed.

If bend portion 20 is made of the same resin material as resin molded body 11 of main portion 10 and resin molded body 41 of main portion 40, a filler (e.g. a glass filler or a carbon filler) is preferably added to the resin material constituting resin molded body 11 and resin molded body 41. This can increase the intensity of main portions 10, 40. In order to increase the intensity efficiently, adding a glass filler is particularly preferable.

In order to make the material of bend portion 20 different from the material of resin molded body 11 of main portion 10 and resin molded body 41 of main portion 40, a conventionally known method, such as the two-color molding, may be used.

The two-color molding is a method for integral molding by combining different resins or different materials. Specifically, resin molded body 11 is molded in a first molding die, and then bend portion 20 is molded in a second molding die, so that resin molded body 11 and bend portion 20 are integrally molded. Alternatively, bend portion 20 may be molded in a first molding die, and then resin molded body 11 may be molded in a second molding die, so that resin molded body 11 and bend portion 20 are integrally molded.

If bend portion 20 is made of a material having a high breaking elongation percentage, bend portion 20 may have the same thickness as resin molded body 11.

Embodiment 4

In the above described embodiments 1 to 3, bend portion 20 is molded by injection molding of resin material. However, an electronic device in embodiment 4 uses a flexible substrate as a bend portion.

(Configuration of Electronic Device)

Figure 6:
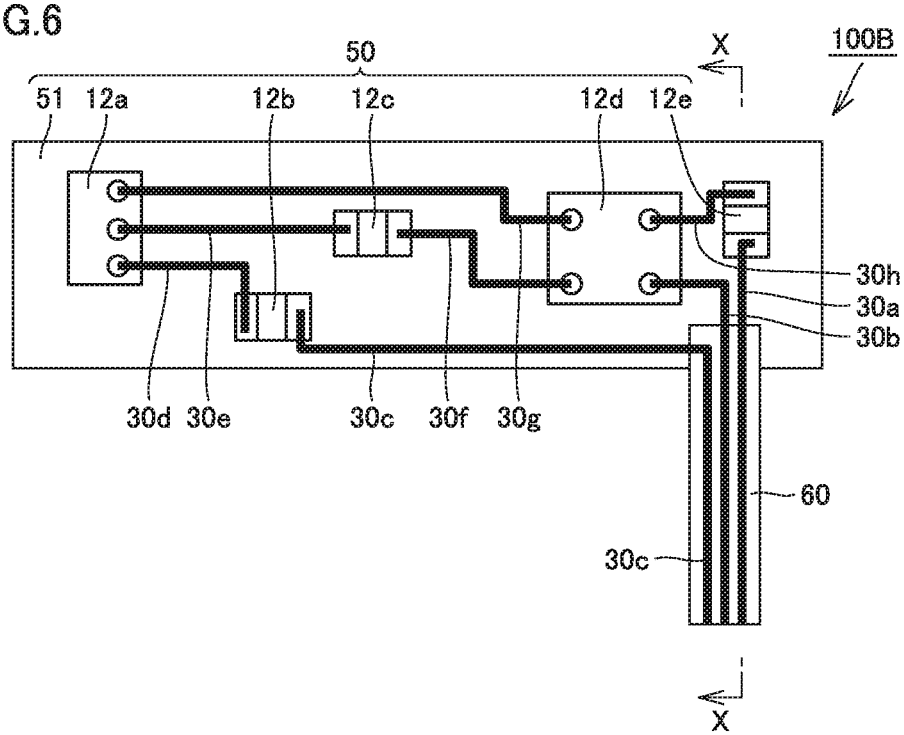
FIG. 6 is a plan view showing a schematic configuration of an electronic device in embodiment 4.
Figure 7:
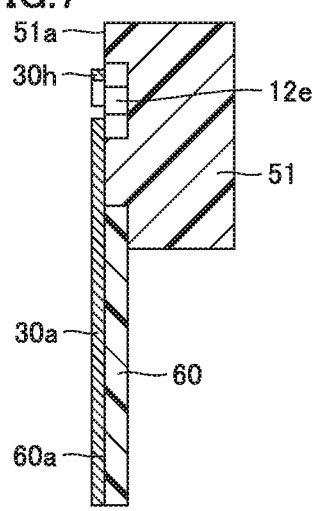
FIG. 7 is a cross-sectional view taken along line X-X and seen in the arrow direction in FIG. 6.

With reference to FIG. 6 and FIG. 7, a configuration of an electronic device 100B in embodiment 4 is described. FIG. 6 is a plan view showing a schematic configuration of electronic device 100B in embodiment 4. FIG. 7 is a cross-sectional view taken along line X-X and seen in the arrow direction in FIG. 6.

As shown in FIG. 6 and FIG. 7, electronic device 100B is different from electronic device 100 in embodiment 1 in that electronic device 100B includes a main portion 50 instead of main portion 10, and includes a bend portion 60 instead of bend portion 20.

Bend portion 60 is a flexible substrate in the form of a film made of, for example, polyimide (PT) or polyethylene terephthalate (PET). The shape of bend portion 60 may be, but not limited to, a rectangular shape for example. The thickness of bend portion 60 may be, but not limited to, 50 µm for example.

Main portion 50 is different from main portion 10 in embodiment 1 in that main portion 50 includes a resin molded body 51, instead of resin molded body 11.

Resin molded body 51 is generally in the form of a plate and is made of resin, such as polycarbonate (PC) or acrylonitrile-butadiene-styrene (ABS). The shape of resin molded body 51 is not particularly limited, and may be designed as appropriate in accordance with the shape of electronic device 100B. The material of resin molded body 51 may be other types of resin (e.g. polypropylene (PP), or elastomer).

Resin molded body 51 has electronic component 12 (12a to 12e) embedded therein, thereby fixing electronic component 12, similarly to resin molded body 11. Resin molded body 51 has electronic component 12 embedded therein, so that electronic component 12 is exposed at an upper surface 51a.

Further, resin molded body 51 supports bend portion 60, with a part of bend portion 60 being embedded in resin molded body 51. Thus, bend portion 60 is continuous with resin molded body 51. In the example shown in FIG. 6 and FIG. 7, resin molded body 51 supports bend portion 60, with the end (including one short side) of rectangular bend portion 60 being embedded in resin molded body 51. Resin molded body 51 supports bend portion 60, with upper surface 51a being continuous with a part (continuous surface 60a) of the surface of bend portion 60. Specifically, resin molded body 51 supports bend portion 60, with upper surface 51a being flush with continuous surface 60a of bend portion 60.

Similarly to embodiment 1, interconnection 30 (30a to 30h) is formed on at least one of upper surface 51a of resin molded body 51 and continuous surface 60a of bend portion 60, and is connected to any of electronic components 12a to 12e (Method for Manufacturing Electronic Device)

Figure 8:
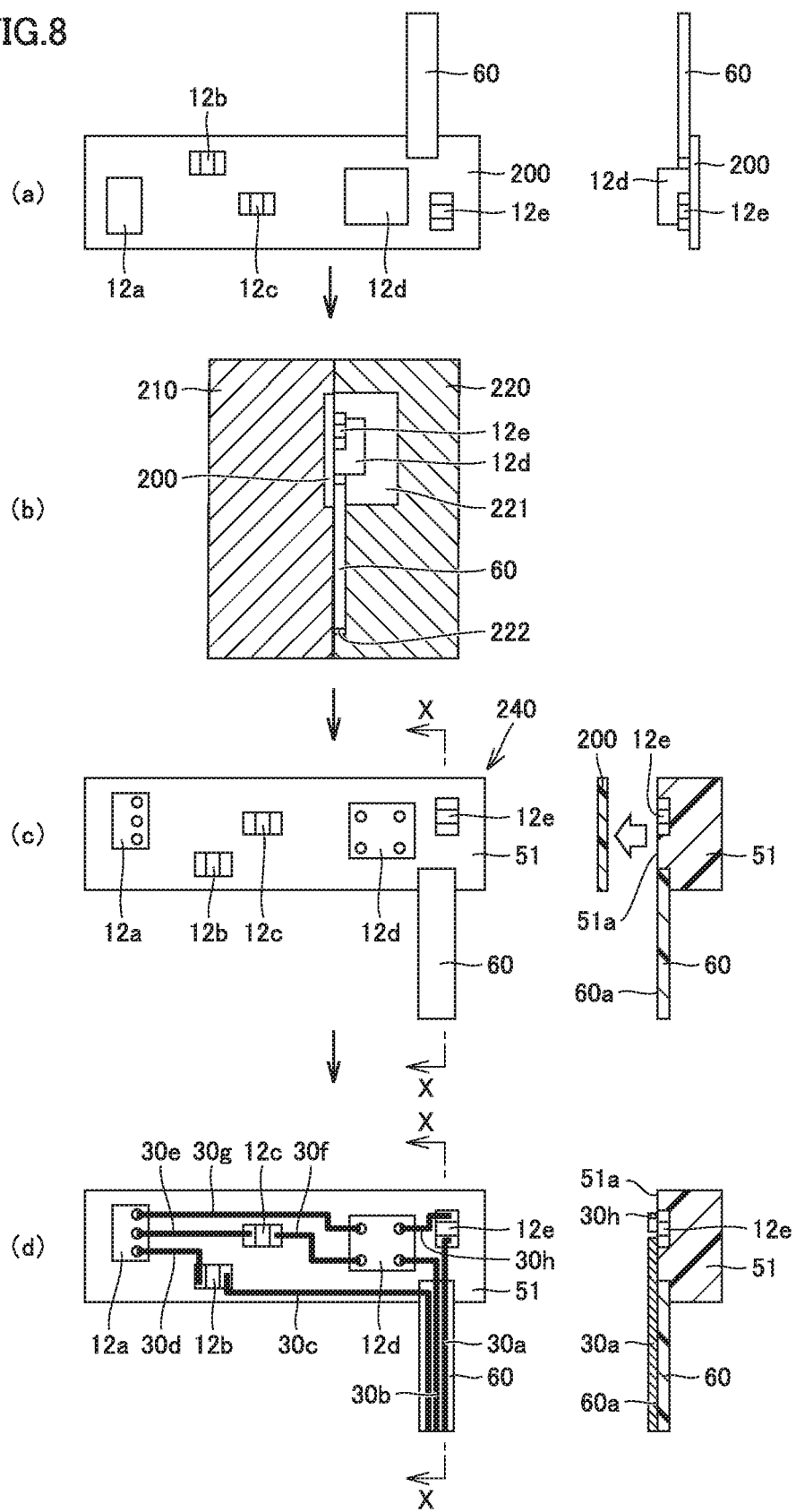
FIG. 8 is a diagram explaining a method for manufacturing an electronic device in embodiment 4.

Next, with reference to FIG. 8, an example method for manufacturing electronic device 100B in embodiment 4 is described. FIG. 8 is a diagram explaining a method for manufacturing electronic device 100B. Diagrams for explaining the first to fourth steps for manufacturing electronic device 100B are shown in (a) to (d) of FIG. 8 respectively. In (a) of FIG. 8, a plan view is shown on the left, and a side view is shown on the right. In (b) of FIG. 8, a cross-sectional view is shown. In each of (c) and (d) of FIG. 8, a plan view is shown on the left, and a cross-sectional view taken along line X-X and seen in the arrow direction in the plan view is shown on the right.

(First Step)

As shown in (a) of FIG. 8, first, electronic components 12a to 12e and bend portion 60 are stuck to rectangular temporary fixation sheet 200 with an adhesive, so as to be temporarily fixed thereto. At this time, electronic components 12a to 12e are stuck in such a manner that the side on which electrodes 13a to 13e are formed is in contact with temporary fixation sheet 200. Only a part of bend portion 60 is stuck to temporary fixation sheet 200. The method for temporarily fixing electronic components 12a to 12e and bend portion 60 to temporary fixation sheet 200 is the same as the first step in embodiment 1, and thus the detailed explanation is not repeated.

(Second Step)

Next, as shown in (b) of FIG. 8, temporary fixation sheet 200 having electronic components 12a to 12e and bend portion 60 temporarily fixed thereto is placed in a molding die formed by combining first die 210 and second die 220.

Similarly to embodiment 1, temporary fixation sheet 200 is fitted into recess 211 defined in first die 210. At this time, bend portion 60 lies substantially across the whole space 222, and a part of bend portion 60 protrudes into space 221.

Injection molding of resin is performed by injecting resin material in space 221 in the molding die formed by combining first die 210 and second die 220. The conditions for the injection molding are the same as those of the second step in embodiment 1.

(Third Step)

As shown in (c) of FIG. 8, a structure 240 obtained by injection molding at the second step is taken out of the molding die. Structure 240 includes resin molded body 51 in which electronic components 12a to 12e are embedded, the resin molded body 51 having the same shape as space 221 in the molding die. Structure 240 also includes bend portion 60 partially embedded in resin molded body 51.

Then, temporary fixation sheet 200 is peeled from structure 240. Thus, surfaces of electronic components 12a to 12e are exposed at upper surface 51a of resin molded body 51. Continuous surface 60a of bend portion 60 that has been stuck to temporary fixation sheet 200 is flush with and continuous with upper surface 51a of resin molded body 51.

(Fourth Step)

As shown in (d) of FIG. 8, after the third step, interconnection 30 (30a to 30h) in a predetermined pattern is formed on upper surface 51a of resin molded body 51 and on continuous surface 60a of bend portion 60. The method for forming interconnection 30 is the same as the fourth step in embodiment 1.

Thus, electronic device 100B is completed, where electronic device 100B is provided with: main portion 50 including electronic component 12 and resin molded body 51; bend portion 60 supported by resin molded body 51; and interconnection 30.

(Advantages)

In electronic device 100B in embodiment 4, resin molded body 51 supports bend portion 60, with a part of bend portion 60 being embedded in resin molded body 51. This provides more reliable connection between bend portion 60 and resin molded body 51 than bonding with an adhesive or the like.

Electronic device 100B is manufactured by the steps in the following (1) to (3):

(1) sticking electronic component 12 and bendable bend portion 60 to temporary fixation sheet 200;

(2) placing temporary fixation sheet 200 in a molding die (formed by combining first die 210 and second die 220) and filling the molding die with resin, thereby molding resin molded body 51 in which electronic component 12 and a part of bend portion 60 are embedded; and (3) forming interconnection (first interconnection) 30 on upper surface (sheet bonded surface) 51a of resin molded body 51, the upper surface 51a having been in contact with temporary fixation sheet 200 and exposed by peeling temporary fixation sheet 200 from resin molded body 51.

In this way, electronic device 100B including bend portion 60 can be easily manufactured. Thus, the manufacturing cost of electronic device 100B can be reduced.

Interconnection 30 is formed also on continuous surface 60a of bend portion 60 continuous with upper surface 51a of resin molded body 51. Thus, electrical connection between main portion 50 and bend portion 60 is achieved by forming interconnection 30 on upper surface 51a of resin molded body 51 and on continuous surface 60a of bend portion 60. This eliminates the need for conventional complicated processes for connecting a flexible substrate to a rigid substrate, and also eliminates the need for an adhesive or other like members. Thus, the manufacturing cost of electronic device 100B can be reduced.

Embodiment 5

An electronic device in embodiment 5 of the present invention, which is a variation of electronic device 100B in embodiment 4, has an interconnection formed beforehand on bend portion 60 which is a flexible substrate.

Figure 9:
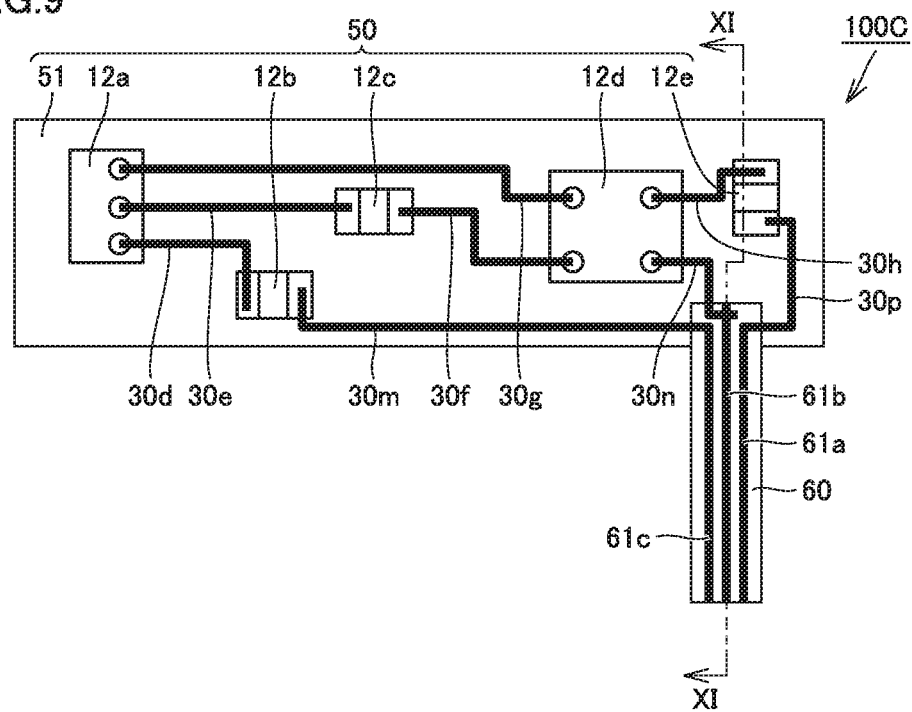
FIG. 9 is a plan view showing a schematic configuration of an electronic device in embodiment 5.
Figure 10:
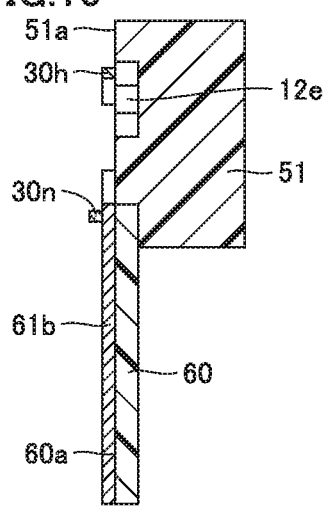
FIG. 10 is a cross-sectional view taken along line XI-XI and seen in the arrow direction in FIG. 9.
Figure 11:
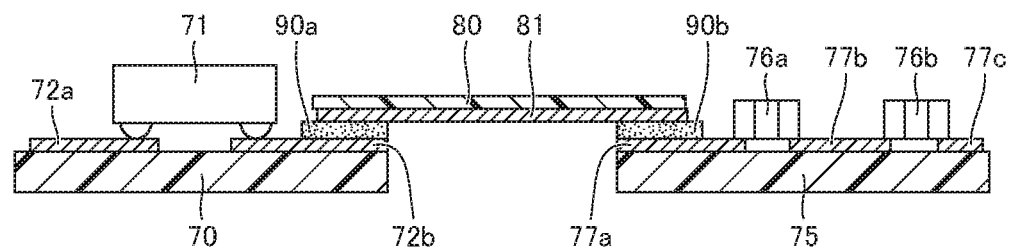
FIG. 11 is a diagram showing an example electronic device that combines rigid substrates and a flexible substrate.

FIG. 9 is a plan view showing a schematic configuration of an electronic device 100C in embodiment 5. FIG. 10 is a cross-sectional view taken along line XI-XI and seen in the arrow direction in FIG. 9.

As shown in FIG. 9 and FIG. 10, electronic device 100C includes main portion 50, bend portion 60, and interconnection (first interconnection) 30 (30d to 30h, 30m, 30n, 30p). An interconnection (second interconnection) 61 (61a to 61c) is formed beforehand on continuous surface 60a of bend portion 60 continuous with upper surface 51a of resin molded body 51.

Interconnection 61 is made of copper having a thickness of, for example, about 12 μm. Alternatively, interconnection 61 may be made of, for example, aluminum instead of copper.

Interconnection 30m is connected to interconnection 61c formed on bend portion 60 and is connected to electronic component 12b. Interconnection 30n is connected to interconnection 61b formed on bend portion 60 and is connected to electronic component 12d. Interconnection 30p is connected to interconnection 61a formed on bend portion 60 and is connected to electronic component 12e.

Thus, a flexible substrate on which interconnections have already been formed can be used as bend portion 60.

Electronic device 100C is manufactured in a manufacturing method similar to electronic device 100B in embodiment 4 described above (see FIG. 8). However, in the first step shown in FIG. 8, bend portion 60 is stuck to temporary fixation sheet 200 so that interconnection 61 faces (in contact with) temporary fixation sheet 200. Accordingly, after the injection molding of resin, interconnection 61 is flush with upper surface (sheet bonded surface) 51a of resin molded body 51 that has been in contact with temporary fixation sheet 200. As a result, in forming interconnection 30, a part of interconnection 30 can be easily connected to interconnection 61. Thus, interconnection 61 on bend portion 60 (which is a flexible substrate) can easily be connected to interconnection 30 formed on resin molded body 51. This eliminates the need for conventional complicated processes for connecting a flexible substrate to a rigid substrate, and also eliminates the need for an adhesive or other like members. Thus, the manufacturing cost of electronic device 100C can be reduced.

It should be understood that the embodiments disclosed herein are by way of example in every respect and without limitation. The scope of the present invention is defined not by the above description but by the terms of the claims, and is intended to include any modification within the meaning and scope equivalent to the terms of the claims.

REFERENCE SIGNS LIST 10, 40, 50: main portion; 11, 41, 51: resin molded body; 11a, 41a, 51a: upper surface; 12 (12a to 12e), 42 (42a to 42c), 71, 76a, 76b: electronic component; 13a to 13e, 43a to 43c: electrode; 20, 60: bend portion; 20a, 60a: continuous surface; 30 (30a to 30p), 61 (61a to 61c), 72a, 72b, 77a, 77c: interconnection; 70, 75, 80: substrate; 81: conductive layer; 90a, 90b: conductive adhesive layer; 100, 100A, 100B, 100C: electronic device; 200: temporary fixation sheet; 210: first die; 211: recess; 220: second die; 221, 222: space; 230, 240: structure

The invention claimed is:

1. An electronic device comprising:
an electronic component;
a resin molded body in which the electronic component is embedded and fixed; and
a bendable bend portion continuous with the resin molded body,
the resin molded body supporting the bend portion, with a part of the bend portion being embedded in the resin molded body, a surface of the resin molded body including an exposed surface at which the electronic component is exposed,
a surface of the bend portion including a continuous surface continuous with the exposed surface,
the electronic device further comprising an interconnection formed on the exposed surface and on the continuous surface, the interconnection being connected to the electronic component.

2. An electronic device comprising:
an electronic component;
a resin molded body in which the electronic component is embedded and fixed; and
a bendable bend portion continuous with the resin molded body,
the bend portion being molded integrally with the resin molded body with resin, the bend portion and the resin molded body being made of different materials,
a surface of the resin molded body including an exposed surface at which the electronic component is exposed, and
a surface of the bend portion including a continuous surface continuous with the exposed surface,
the electronic device further comprising an interconnection formed on the exposed surface and on the continuous surface, the interconnection being connected to the electronic component.

3. The electronic device according to claim 1, wherein the interconnection extends continuously from the electronic component to the continuous surface.

4. The electronic device according to claim 1, wherein the interconnection includes
a first interconnection formed on the exposed surface and connected to the electronic component, and
a second interconnection formed on the continuous surface beforehand and connected to the first interconnection.

5. An electronic device comprising:
an electronic component;
a resin molded body in which the electronic component is embedded and fixed; and
a bendable bend portion continuous with the resin molded body,
the bend portion being molded integrally with the resin molded body with resin,
the bend portion and the resin molded body being made of different materials,
a material of the bend portion being higher in breaking elongation percentage than a material of the resin molded body.

6. The electronic device according to claim 5, wherein the bend portion is made of a resin having a breaking elongation percentage of 300% or more.

7. The electronic device according to claim 6, wherein the resin molded body is made of a resin having a breaking elongation percentage of 150% or less.

8. The electronic device according to claim 5, wherein the resin molded body contains a filler.

9. The electronic device according to claim 1, wherein a material of the bend portion is higher in breaking elongation percentage than a material of the resin molded body.

10. The electronic device according to claim 9, wherein the bend portion is made of a resin having a breaking elongation percentage of 300% or more.

11. The electronic device according to claim 10, wherein the resin molded body is made of a resin having a breaking elongation percentage of 150% or less.

12. The electronic device according to claim 1, wherein the resin molded body contains a filler.

* * * * *